(12) United States Patent
Sapozhnikov et al.

(10) Patent No.: US 8,922,951 B2
(45) Date of Patent: Dec. 30, 2014

(54) DATA STORAGE DEVICE WITH VARIABLE ANISOTROPY SIDE SHIELD

(71) Applicant: Seagate Technology LLC, Cupertino, CA (US)

(72) Inventors: Victor Boris Sapozhnikov, Minnetonka, MN (US); Mohammed Shariat Ullah Patwari, Eden Prairie, MN (US); Shaun Eric McKinlay, Eden Prairie, MN (US); Konstantin Rudolfovich Nikolaev, Bloomington, MN (US); Eric Walter Singleton, Maple Plain, MN (US); Jae-Young Yi, Prior Lake, MN (US)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 13/710,945

(22) Filed: Dec. 11, 2012

(65) Prior Publication Data
US 2014/0160596 A1    Jun. 12, 2014

(51) Int. Cl.
*G11B 5/39* (2006.01)
*G11B 5/11* (2006.01)
(52) U.S. Cl.
CPC ............. *G11B 5/11* (2013.01); *G11B 5/3912* (2013.01); *G11B 5/3932* (2013.01)
USPC .................. 360/319; 360/324; 360/324.12
(58) Field of Classification Search
CPC ....... G11B 5/11; G11B 5/3906; G11B 5/3912
USPC .......... 360/319, 324.1, 324.11, 324.12, 324.2, 360/324

See application file for complete search history.

(56) References Cited

U.S. PATENT DOCUMENTS

| | | | |
|---|---|---|---|
| 6,680,829 B2 | 1/2004 | Chen et al. | |
| 6,980,403 B2 | 12/2005 | Hasegawa | |
| 7,035,062 B1 * | 4/2006 | Mao et al. | 360/324.2 |
| 7,102,854 B2 | 9/2006 | Wang et al. | |
| 7,379,277 B2 | 5/2008 | Burbank et al. | |
| 7,436,634 B2 | 10/2008 | Carey et al. | |
| 8,048,545 B2 | 11/2011 | Li et al. | |
| 8,125,746 B2 * | 2/2012 | Dimitrov et al. | 360/324.2 |
| 8,238,059 B1 | 8/2012 | Tang et al. | |
| 8,369,048 B2 * | 2/2013 | Miyauchi et al. | 360/319 |
| 8,462,467 B2 * | 6/2013 | Yanagisawa et al. | 360/319 |
| 2002/0030947 A1 * | 3/2002 | Chen et al. | 360/319 |
| 2003/0174446 A1 * | 9/2003 | Hasegawa | 360/319 |
| 2006/0114617 A1 * | 6/2006 | Nikitin | 360/324.1 |
| 2007/0139820 A1 * | 6/2007 | Carey et al. | 360/126 |
| 2008/0117552 A1 * | 5/2008 | Zhou et al. | 360/319 |
| 2011/0007426 A1 | 1/2011 | Qiu et al. | |
| 2011/0216443 A1 * | 9/2011 | Hirata et al. | 360/123.12 |
| 2012/0087046 A1 * | 4/2012 | Yanagisawa et al. | 360/294 |
| 2012/0250189 A1 * | 10/2012 | Degawa et al. | 360/235.4 |
| 2012/0281319 A1 * | 11/2012 | Singleton et al. | 360/319 |
| 2013/0021697 A1 * | 1/2013 | Dimitrov et al. | 360/128 |
| 2014/0022673 A1 * | 1/2014 | Benakli et al. | 360/235.4 |

* cited by examiner

*Primary Examiner* — Jefferson Evans
(74) *Attorney, Agent, or Firm* — Hall Estill Attorneys at Law

(57) ABSTRACT

Various embodiments may be generally directed to a data storage device with at least a magnetic element having a magnetic stack positioned adjacent to and separated from at least one side shield on an air bearing surface (ABS). The side shield can be configured with a predetermined anisotropy variation along a down-track direction.

20 Claims, 4 Drawing Sheets

DATA STORAGE DEVICE WITH VARIABLE ANISOTROPY SIDE SHIELD

SUMMARY

Various embodiments are generally directed to a magnetic element shielded as part of a data storage device.

In accordance with various embodiments, a magnetic element may have a magnetic stack positioned adjacent to and separated from a side shield on an air bearing surface (ABS). The side shield can be configured with a predetermined anisotropy variation along a down-track direction.

DETAILED DESCRIPTION

As data storage devices have advanced to higher data capacity and faster data access times, various data components have reduced in size. For example, data bits have become more densely packed on narrower data tracks of a data storage media. Such an increase in data bit density can result inadvertent reading of data bits from adjacent data tracks in a "side reading" condition. The introduction of lateral magnetic shields to a data access element can mitigate side shielding, but may introduce magnetic asymmetry and instability as lateral shields conduct magnetic flux. Hence, there is a continued demand to stabilize magnetic shielding in reduced form factor data storage devices.

Accordingly, a magnetic element can be configured with a magnetic stack adjacent to and separated from a side shield on an air bearing surface with the side shield having a predetermined anisotropy gradient along a down-track direction. The ability to tune the side shield to varying predetermined anisotropy gradients can allow intrinsic anisotropy to be uniformly distributed in the cross-track direction, which aids in stabilizing magnetization in the magnetic element. A tuned side shield configuration providing a predetermined anisotropy gradient may further allow for optimized side shield magnetization control in relation to the magnetically sensing aspects of the magnetic stack to minimize magnetization asymmetry.

Figure 1:
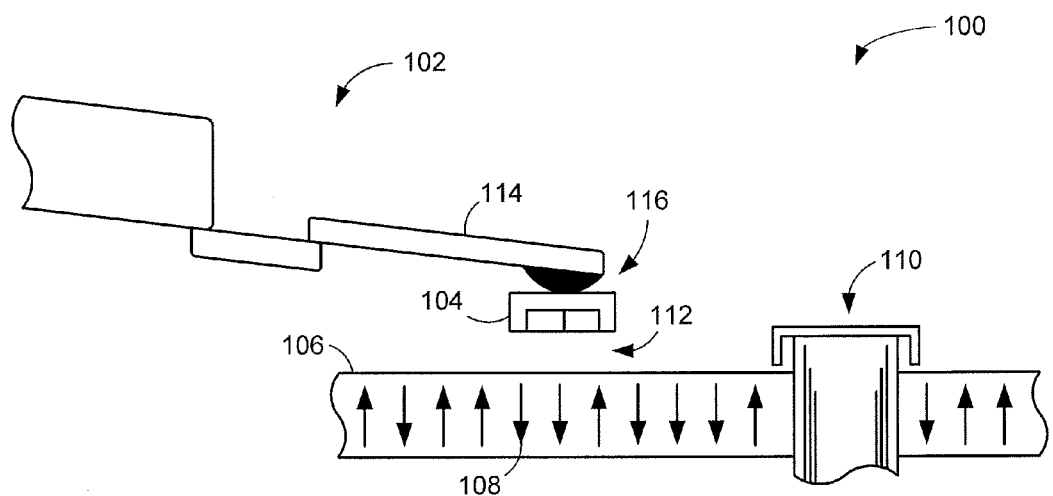
FIG. 1 is a block representation of an exemplary portion of a data storage device in accordance with various embodiments.

While tuned magnetic elements may be utilized by a variety of data storage devices, such as rotating media data readers and writers, FIG. 1 generally illustrates a block representation of a transducing portion 100 of an example data storage device that can utilize tuned side shields in accordance with various embodiments. The transducing portion 100 is shown in a non-limiting environment having an actuating assembly 102 that positions a transducing head 104 over a magnetic storage media 106 that is capable of storing programmed bits 108. The storage media 106 is attached to a spindle motor 110 that rotates during use to produce an air bearing surface (ABS) 112 on which a slider portion 114 of the actuating assembly 102 flies to position a head gimbal assembly (HGA) 116, which includes the transducing head 104, over a predetermined portion of the media 106.

The transducing head 104 can include one or more transducing elements, such as a magnetic writer and magnetically responsive reader, which operate to program and read data from the storage media 106, respectively. In this way, controlled motion of the actuating assembly 102 causes the transducers to align with tracks (not shown) defined on the storage media surfaces to write, read, and rewrite data. It should be noted that the term "stack" is an unlimited term within this disclosure that can be one or more magnetic and non-magnetic layers capable of magnetic shielding, reading, and writing.

Throughout the present application, the term "stack" will be understood to mean a component positioned on the ABS to conduct magnetic flux in accordance with predetermined characteristics, such as rotating a magnetic free layer, inducing a magnetic polarity onto an adjacent data storage media, and directing flux away from a data sensing region of a magnetic element. As an example, but not in any way limiting, a side stack can be a single layer of magnetically conductive material while a magnetic stack may be a lamination of magnetic and non-magnetic layers capable of writing or reading programmed data bits.

As data bits 108 become more densely positioned in data tracks having smaller widths, the head 104 may receive magnetic flux from inadvertent data bits located on adjacent data tracks, which induces magnetic noise and asymmetry detrimental to accurate data sensing. The addition of one or more laterally adjacent magnetic shields can reduce the migration of errant magnetic flux to the magnetically sensitive portions of the head 104, but at the cost of increased magnetic instability as the shields become magnetically saturated.

Figure 2:
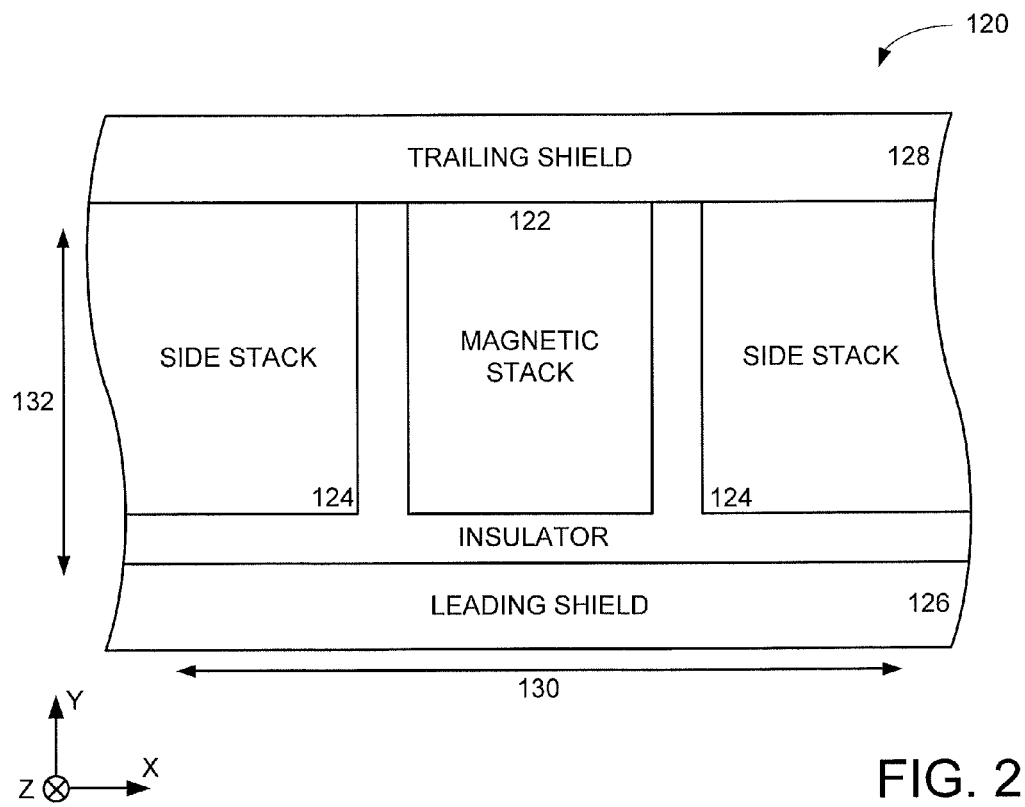
FIG. 2 display an ABS view block representation of a portion of an example magnetic element constructed and operated in accordance with some embodiments.

FIG. 2 shows a block representation of an ABS portion of an example magnetic element 120 capable of being used in the transducing portion 100 of FIG. 1. The magnetic element 120 is configured with a magnetic stack 122 disposed between laterally adjacent side shields 124. The lateral position and magnetically separated construction of the side shields 124 from the magnetic stack 22 may shield errant magnetic flux from reaching the magnetic stack 122. Likewise, leading 126 and trailing 128 shields can operate individually and in concert with the side shields 124 to define a data bit window with cross-track 130 and down-track 132 dimensions in which the magnetic stack 122 senses data bits across an air bearing.

The material, shape, and position of the various shields 124, 126, and 128 can tune the magnetic resolution of the magnetic stack 122 to shrink the data bit window to correspond with the data bit density and data track width of an adjacent data storage media. However, the soft magnetic material of side stacks 124 and interruption of the material at the junction between the side stack 124 and trailing shield 128 can induce magnetic instability and asymmetry in the sensitive portions of the magnetic stack 122.

Figure 3:
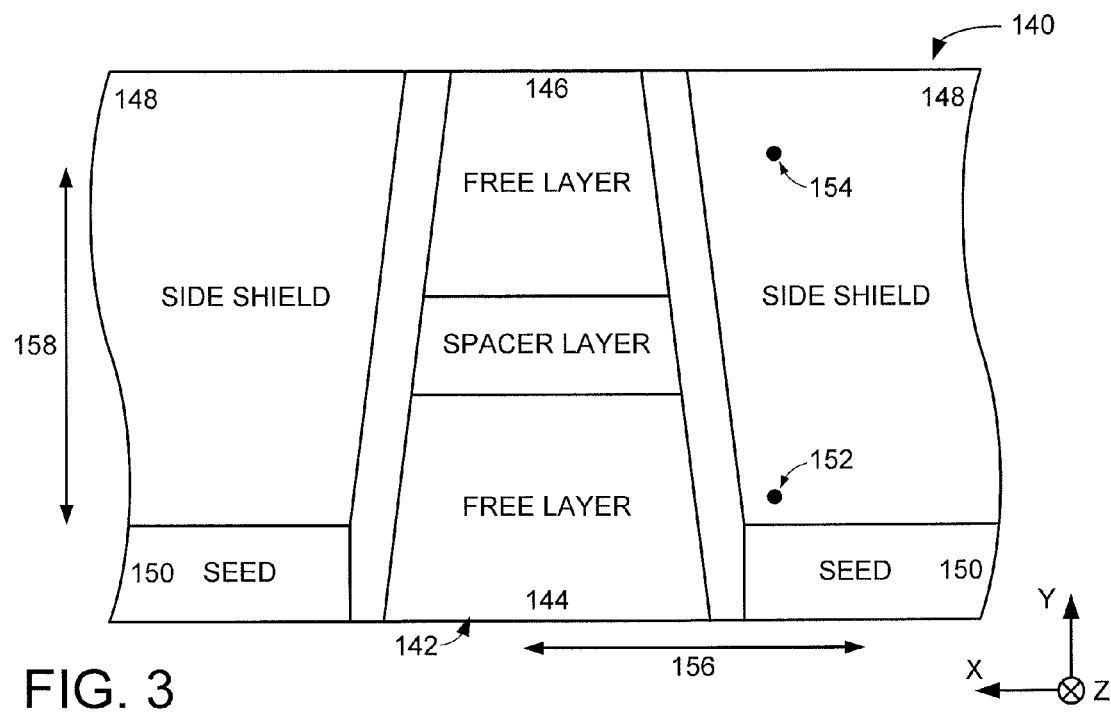
FIG. 3 provides an ABS view block representation of a portion of an example magnetic element capable of being used in the data storage device of FIG. 1.

With the continued elevation of data bit densities and the increasingly close construction of side shields 124 to the magnetic stack 122 in mind, FIG. 3 displays an ABS portion of an example magnetic element 140 constructed in accordance with various embodiments. The magnetic element 140 is shown with a magnetic stack 142 constructed with a trapezoidal shape and as a "trilayer" magnetic lamination characterized by first and second magnetically free layers 144 and 146 and a lack of any fixed magnetizations, such as a pinned reference layer. The magnetic stack 142 is disposed between side shields 148 that are respectively formed atop seed layers 150 and shaped with sidewalls tapered at an angle that is the same, or different, than the taper of the magnetic stack 142 sidewalls.

Each side shield 148 can be configured with a predetermined anisotropy gradient (variation) where the anisotropy at point 152 differs from down-track point 154. The anisotropy in the down-track direction can tuned to vary in a number of non-limiting manners, such as with anisotropy that continuously increases or decreases in magnitude in the down-track direction (or vice versa) in the form of a gradient. Contrawise, the anisotropy may have variations with one or more areas of increased magnitude and one or more areas of decreased magnitude along the down-track direction.

Various embodiments construct the respective side shields 148 with different anisotropy gradients while other embodiments configure the same anisotropy gradient for both side shields 148. In either a common or disimilar anisotropy gradient embodiment, uniaxial anisotropy can be set to be substantially cross-track, along the X direction, while anisotropy gradually decreases from point 152 to down-track point 154. That is, the anisotropy of one, or both, side shields 148 can be configured to be strongest proximal to the seed layer 150 and weakest distal the seed layer 150 in accordance with an anisotropy gradient that decreases in a uniform or non-uniform manner along the down-track direction.

While the predetermined anisotropy gradient can be formed in a number of non-limiting manners, some embodiments deposit the seed layer 150 with a predetermined texture, such as by forming portions of the layer with oblique incidence sputtering. Such a predetermined texture can induce anisotropy that has a predetermined gradient along the down-track direction while maintaining a substantially uniform cross-track anisotropy profile. The ability to tune the anisotropy of one, or both, side shields 148 in the cross-track 156 and down-track 158 directions allows for more precise magnetization control as magnetic flux saturates the side shield 148 in a pattern corresponding with the predetermined anisotropy.

Figure 4:
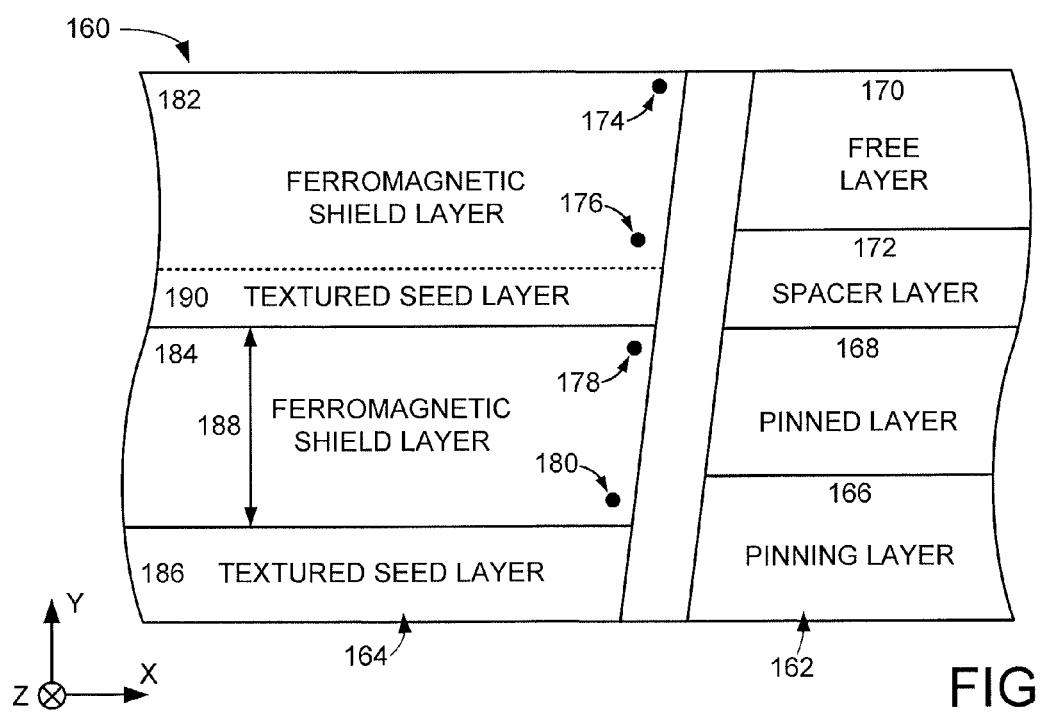
FIG. 4 displays an ABS view block representation of a portion of an example magnetic element constructed and operated in accordance with some embodiments.

FIG. 4 illustrates a block representation of an ABS view of another example magnetic element 160 constructed in accordance with some embodiments that employs an abutted junction magnetic stack 162 laterally adjacent and separated from a laminated side shield 164. The fixed magnetization incorporated into magnetic stack 162 can be formed in any variety of non-limiting of fixed magnetization configurations, but in the embodiment of FIG. 4 a pinning layer 166, such as an antiferromagnet, fixes the magnetization of a pinned layer 168. The magnetic stack 162 further has a magnetically free layer 170 separated from the pinned layer 168 by a non-magnetic spacer layer 172, which allows for magnetoresistive sensing of data bits.

The predetermined anisotropy gradient for the side shield 164 can be designed and formed in relation to the construction of the magnetic stack 162. As an example, a predetermined minimal anisotropy can be positioned proximal the magnetic free layer 170 at points 174 and 176 while a predetermined elevated anisotropy proximal the pinned layer 168 at points 178 and 180. Such anisotropy distribution may correspond with a gradient that continually reduces the anisotropy of the side shield 164 from point 180 to point 174 through points 178 and 176, which may be constructed by depositing a series of ferromagnetic shield layers 182 and 184 on a textured seed layer 186.

Deposition of the ferromagnetic shield layers 182 and 184 can be tuned by adjusting layer thickness 188, material, and seed layer 186 texture to provide different, but continually decreasing, anisotropies for the respective points 174, 176, 178, and 180. In various embodiments, a predetermined anisotropy gradient of 600 Oersted from point 180 to point 174 is set by positioning a second textured seed layer 190 between the ferromagnetic shield layers 182 and 184 to provide a texture for the second ferromagnetic layer 184 that differs from the texture of the first seed layer 186. Similar anisotropy characteristics may be formed by depositing portions of the ferromagnetic shield layer 184 with an oblique incidence sputtering or post-deposition processing that provides a texture for ferromagnetic shield layer 182 that differs from the texture of the seed layer 186.

Figure 5:
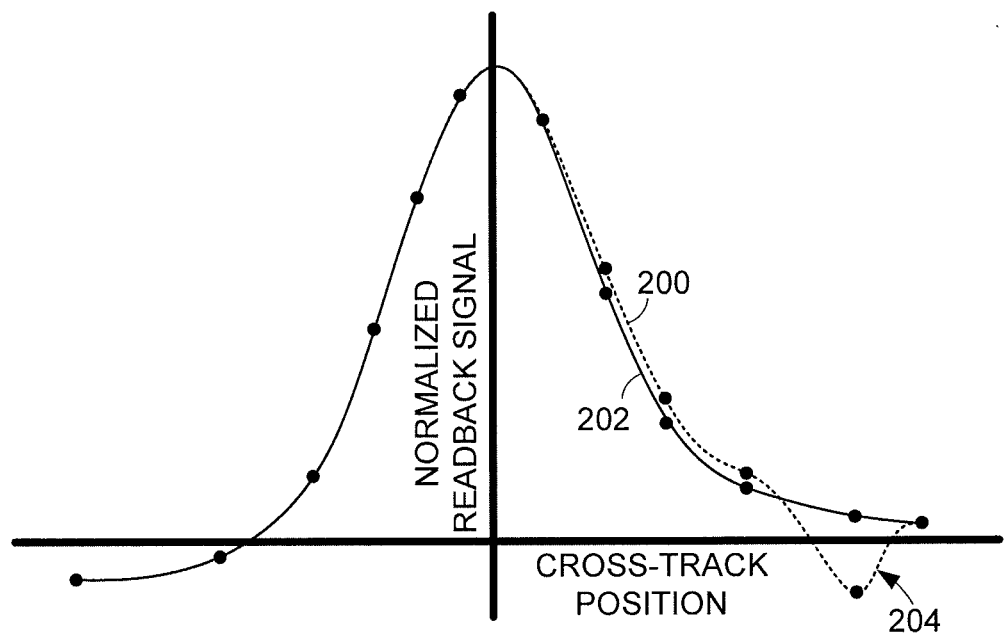
FIG. 5 graphs operational data from example magnetic elements constructed and operated in accordance with various embodiments.

Regardless of the number of layers, material, and textures implemented into the side shield 164, the ability to tune those and other shield characteristics can correspond to magnetic operation catered to high data bit density, reduced form factor data storage environments. FIG. 5 graphs operational data corresponding to example magnetic elements tuned with a predetermined side shield anisotropy gradient in accordance with various embodiments. Segmented 200 and solid 202 lines respectively correspond to magnetic elements that have no side shield anisotropy (line 200) and 600 Oersted average side shield anisotropy (line 202). As shown, the lack of anisotropy gradient in a side shield can produce a readback signal dip 204 for certain cross-track positions in a magnetic stack.

Figure 6:
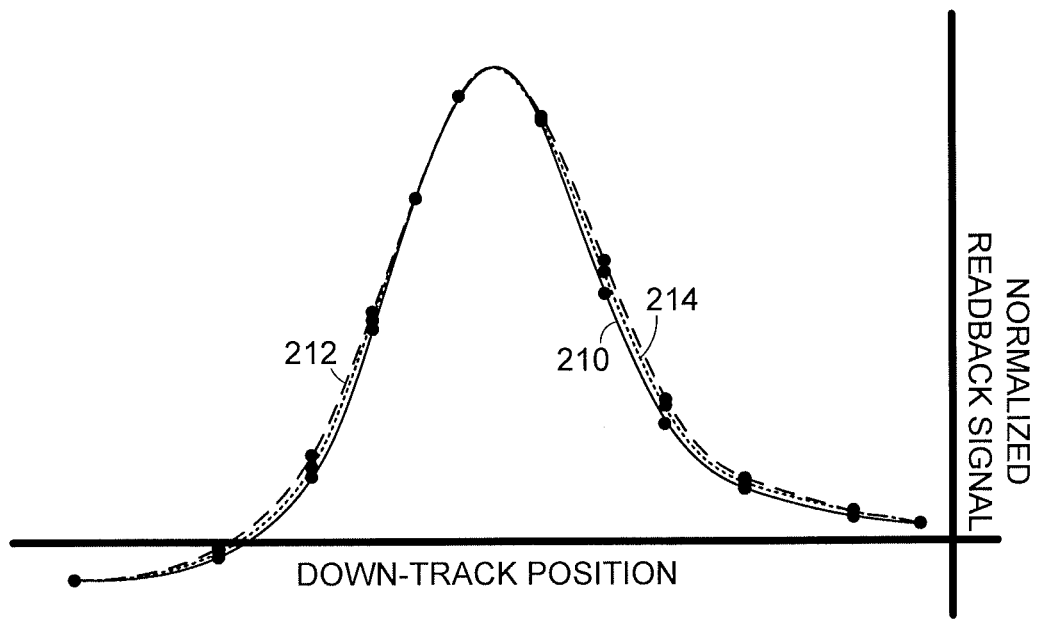
FIG. 6 plots operational data from example magnetic elements constructed and operated in accordance with some embodiments.

The tuning of the anisotropy in a side shield, as represented in a non-limiting configuration, can eliminate the signal dip 204 by making side shield magnetization stability more robust, which reduces magnetic stack instability and asymmetry. FIG. 6 plots how differently tuned example magnetic elements exhibit similar readback signal in relation to the down-track position on the magnetic stack. The minimal difference between a magnetic element having a side shield with a 10 Oersted average anisotropy, as represented by solid line 210, and the magnetic element with a 1000 Oersted average anisotropy, as represented by segmented line 212, illustrates how tuned side shield configurations can optimize cross-track magnetic resolution, as displayed in FIG. 5, without being a detriment to down-track magnetic resolution, as displayed in FIG. 6.

A tuned embodiment may configure a side shield with a 400 Oersted average anisotropy and anisotropy gradient that uniformly decreases that anisotropy to near zero proximal a magnetically free layer. Such an embodiment is generally represented by segmented line 214, which displays the down-track resolution that corresponds to optimized performance metrics, like PW50. It should be noted that the tuned configuration of a side shield anisotropy gradient is meant as the average anisotropy change along over a down-track distance, such as from point 180 to point 174.

Figure 7:
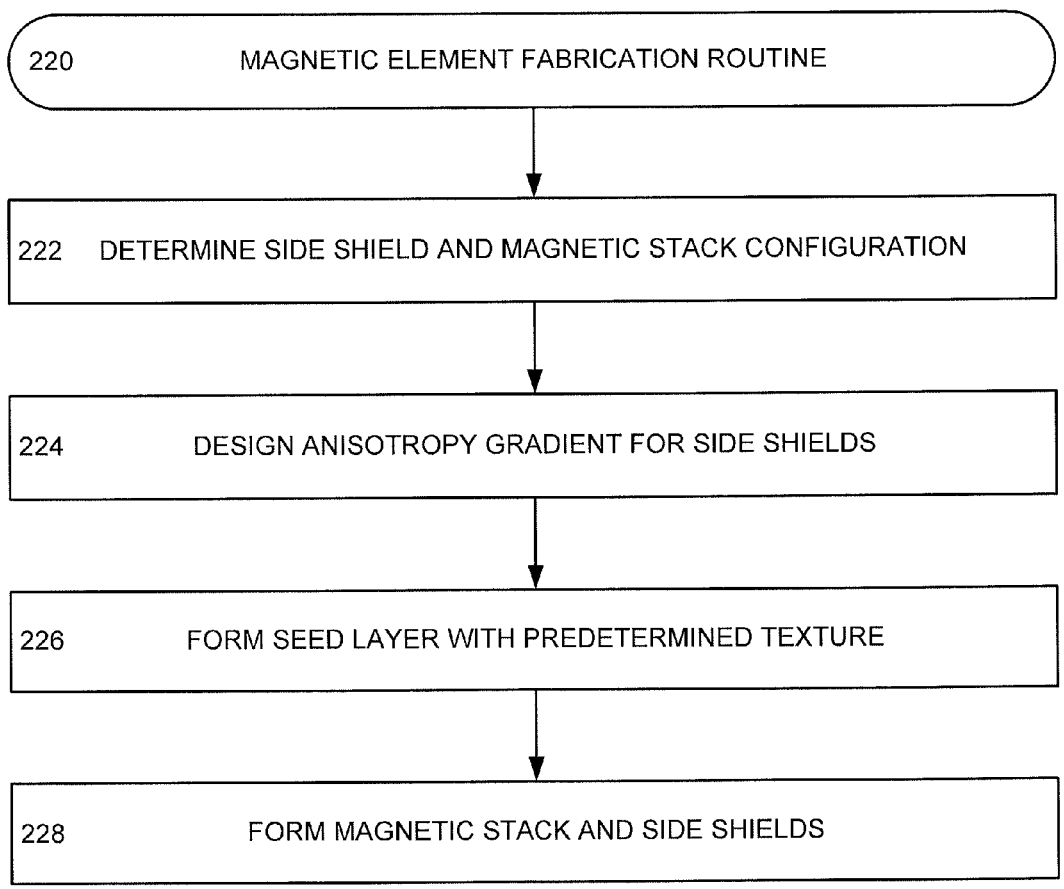
FIG. 7 provides a flowchart generally illustrative of an example magnetic element fabrication routine conducted in accordance with various embodiments.

FIG. 7 provides an exemplary magnetic element fabrication routine 220 conducted in accordance with various embodiments to provide side shield laminations configured to provide flux closure through the top shield. The routine 220 can begin by determining the configuration of the side shields and magnetic stack in step 222. As discussed above, the number of layers, material, and thickness of the side shield layers can be chosen in relation to the magnetic stack. For example, the magnetic stack can be constructed as a trilayer with no fixed magnetization or as a reference stack with a fixed magnetization layer.

The determination of the configurations of the respective side shield and magnetic stack in step 222 then advances the routine 220 to step 224 where at least the anisotropy gradient of the side shield is designed. Various embodiments configure the anisotropy gradient in relation to the design of the magnetic stack. For instance, a magnetic stack including a fixed magnetization can choose an anisotropy gradient that positions a low anisotropy proximal a free layer of the magnetic stack. Step 226 next forms the one or more seed layers with a predetermined texture that corresponds to the anisotropy gradient designed in step 224. The manner of texture formation may be determined in steps 224 and 226, but are not limited to any particular means, such as oblique sputtering and post-formation processing.

In some embodiments, a single seed layer is formed in step 226 that continuously extends from one side shield to another, across the magnetic stack, which allows the texture of the seed layer to induce anisotropy in both the side shields and the magnetic stack itself. Regardless of how the seed layer is textured or shaped, step 228 can subsequently form the magnetic stack and side shields in concurrent or successive deposition processes conforming to the dimensions and materials determined in steps 222 and 224.

It can be appreciated that through the routine 220, a magnetic element with tuned magnetic stack and side shields can be constructed to provide optimized magnetic stability and asymmetry. However, the routine 220 is not limited as the various steps can be omitted, changed, and added. For instance, the routine 220 can further include steps that form and process one or more additional seed layers with predetermined textures between side shield ferromagnetic layers to provide the predetermined anisotropy gradient designed in step 224.

It can be appreciated that the tuning of one or more side shields in a magnetic element can provide reduced form factor data transducing components catered to increased data bit density environments. The ability to tune the magnetic saturation of a side shield by setting a predetermined anisotropy gradient allows for increased control of side shield magnetization, which can be direct magnetic flux to predetermined portions of the side shields that are distal the magnetically sensitive regions of an adjacent magnetic stack. Moreover, the construction of a side shield with a predetermined anisotropy gradient can provide a finer data bit magnetic window from a magnetic stack without degrading cross-track or down-track resolution.

It is to be understood that even though numerous characteristics and advantages of various embodiments of the present disclosure have been set forth in the foregoing description, together with details of the structure and function of various embodiments, this detailed description is illustrative only, and changes may be made in detail, especially in matters of structure and arrangements of parts within the principles of the present disclosure to the full extent indicated by the broad general meaning of the terms in which the appended claims are expressed. For example, the particular elements may vary depending on the particular application without departing from the spirit and scope of the present technology.

What is claimed is:

1. A data storage device comprising a trilayer magnetic sensor comprising first and second magnetically free layers without a magnetically pinned reference structure, the trilayer magnetic reader sensor positioned adjacent to and separated from a side shield on an air bearing surface (ABS), the side shield configured with a predetermined non-uniform anisotropy gradient along a down-track direction.

2. The data storage device of claim 1, wherein the trilayer magnetic sensor comprising a non-magnetic spacer layer separating the first and second magnetically free layers.

3. The data storage device of claim 1, wherein the predetermined non-uniform anisotropy gradient is provided by a seed layer contacting the side shield.

4. The data storage device of claim 3, wherein the seed layer has a predetermined texture formed with oblique incidence sputtering.

5. The data storage device of claim 3, wherein the seed layer has a predetermined texture formed with post deposition processing.

6. The data storage device of claim 1, wherein the trilayer magnetic sensor has tapered sidewalls and is shaped substantially as a trapezoid.

7. The data storage device of claim 1, wherein the predetermined non-uniform anisotropy gradient varies along the down-track direction.

8. The data storage device of claim 7, wherein the predetermined anisotropy gradient decreases along the down-track direction.

9. The data storage device of claim 1, wherein the side shield has a uniform uniaxial anisotropy along a cross-track direction, the cross-track direction being orthogonal to the down-track direction.

10. The data storage device of claim 1, wherein the side shield has a sidewall angled to substantially match a sidewall of the trilayer magnetic sensor.

11. An apparatus comprising a magnetic reader stack comprising at least one fixed magnetization layer and a magnetically free layer, the magnetic reader stack disposed between and separated from first and second side shields on an air bearing surface (ABS), each side shield configured with respective predetermined non-uniform anisotropy gradients along a down-track direction.

12. The apparatus of claim 11, wherein the first side shield comprises a first predetermined non-uniform anisotropy gradient that substantially matches a second predetermined non-uniform anisotropy gradient of the second side shield.

13. The apparatus of claim 11, wherein the first side shield comprises a first predetermined non-uniform anisotropy gradient that is dissimilar to a second predetermined non-uniform anisotropy gradient of the second side shield.

14. The apparatus of claim 11, wherein the magnetic reader stack comprises a non-magnetic spacer layer disposed between the at least one fixed magnetization layer and the magnetically free layer.

15. The apparatus of claim 14, wherein the predetermined non-uniform anisotropy gradient positions a region of least anisotropy proximal the magnetically free layer.

16. The apparatus of claim 11, wherein a seed layer provides the predetermined non-uniform anisotropy gradients for each side shield, the seed layer continuously extending from the first side shield to the second side shield and configured with a predetermined texture.

17. The apparatus of claim 11, wherein the predetermined non-uniform anisotropy gradient varies by at least 600 Oersted along the down-track direction.

18. A data element comprising a magnetic reader stack positioned adjacent to and separated from a laminated side shield on an air bearing surface (ABS), the laminated side shield configured with a predetermined non-uniform anisotropy gradient along a down-track direction and a uniform uniaxial anisotropy along a cross-track direction, the cross-track direction being orthogonal to the down-track direction.

19. The data element of claim 18, wherein the laminated side shield comprises at least two ferromagnetic shield layers deposited on a first seed layer configured with a first predetermined texture and anisotropy to provide the predetermined non-uniform anisotropy gradient for each ferromagnetic shield layer.

20. The data element of claim 19, wherein a second seed layer is positioned between two of the ferromagnetic shield layers, the second seed layer configured with a second predetermined anisotropy different than the first predetermined anisotropy.

* * * * *